(12) United States Patent
Saga et al.

(10) Patent No.: US 7,767,585 B2
(45) Date of Patent: Aug. 3, 2010

(54) METHOD OF CLEANING AND PROCESS FOR PRODUCING SEMICONDUCTOR DEVICE

(75) Inventors: Koichiro Saga, Kanagawa (JP); Kenji Yamada, Tokyo (JP); Tomoyuki Azuma, Tokyo (JP); Yuji Murata, Kanagawa (JP)

(73) Assignees: Sony Corporation, Tokyo (JP); Mitsubishi Gas Chemical Company, Inc., Tokyo (JP)

( * ) Notice: Subject to any disclaimer, the term of this patent is extended or adjusted under 35 U.S.C. 154(b) by 0 days.

(21) Appl. No.: 12/066,103

(22) PCT Filed: Sep. 5, 2006

(86) PCT No.: PCT/JP2006/317557

§ 371 (c)(1),
(2), (4) Date: Mar. 16, 2009

(87) PCT Pub. No.: WO2007/029703

PCT Pub. Date: Mar. 15, 2007

(65) Prior Publication Data

US 2009/0221143 A1    Sep. 3, 2009

(30) Foreign Application Priority Data

Sep. 7, 2005  (JP) .............................. 2005-258738

(51) Int. Cl.
*H01L 21/302* (2006.01)
*H01L 21/461* (2006.01)
(52) U.S. Cl. .................... 438/720; 438/633; 438/637; 438/638; 438/687; 438/691; 438/714; 438/906; 257/E21.224; 257/E21.219
(58) Field of Classification Search ................ 438/633, 438/637, 638, 687, 691, 906; 257/E21.224, 257/E21.219
See application file for complete search history.

(56) References Cited

U.S. PATENT DOCUMENTS 5,868,856 A   2/1999   Douglas et al.
5,868,862 A   2/1999   Douglas et al.

(Continued)

FOREIGN PATENT DOCUMENTS

EP           0 822 583 A2    2/1998

(Continued)

*Primary Examiner*—Michelle Estrada
(74) *Attorney, Agent, or Firm*—Antonelli, Terry, Stout & Kraus, LLP.

(57) ABSTRACT

A method of cleaning for removing metal compounds attached to a surface of a substrate, wherein the cleaning is conducted by supplying a supercritical fluid of carbon dioxide comprising at least one of triallylamine and tris(3-aminopropyl)amine to the surface of the substrate and a process for producing a semiconductor device using the method of cleaning are provided. In accordance with the method of cleaning and the method for producing a semiconductor device using the method, etching residues or polishing residues containing metal compounds are efficiently removed selectively from the electroconductive material forming the electroconductive layer. When the electroconductive layer is a wiring, an increase in resistance due to residual metal compounds can be suppressed, and an increase in the leak current due to diffusion of the metal from the metal compounds to the insulating film can be prevented. Therefore, reliability on the wiring is improved, and the yield of the semiconductor device can be increased.

7 Claims, 7 Drawing Sheets

U.S. PATENT DOCUMENTS

| | | | |
|---|---|---|---|
| 6,500,605 B1 * | 12/2002 | Mullee et al. | 430/329 |
| 6,610,152 B1 * | 8/2003 | Babain et al. | 134/3 |
| 2003/0202792 A1 | 10/2003 | Goshi | |
| 2004/0221875 A1 | 11/2004 | Saga et al. | |
| 2004/0259357 A1 | 12/2004 | Saga | |

FOREIGN PATENT DOCUMENTS

| | | |
|---|---|---|
| EP | 0 829 312 B1 | 6/2003 |
| JP | 10-099806 | 4/1998 |
| JP | 10-135170 | 5/1998 |
| JP | 2004-152925 | 5/2004 |
| JP | 2004-249189 | 9/2004 |

* cited by examiner (d)

24 contact hole
34
33
23 cap insulating film
19

(e)

33
34
33'
23

(f)

P' 24  25 wiring groove
P
23
22 low permittivity insulating film (g)

(h)

(i)

(j)

(k)

(l)

(a)

(b)

(c)

(a)

(b)

METHOD OF CLEANING AND PROCESS FOR PRODUCING SEMICONDUCTOR DEVICE

TECHNICAL FIELD

The present invention relates to a method of cleaning and a process for producing a semiconductor device. More particularly, the present invention relates to a method of cleaning in the formation of a wiring structure constituted with a copper wiring and a low permittivity insulating film and a process for producing a semiconductor device using the method of cleaning.

BACKGROUND ART

As the semiconductor devices are more highly integrated recently, the processing dimension of a wiring required for forming circuits becomes finer, and a wiring has an increased number of layers. It is also required that consumption of electricity be decreased and the operating speed be increased as the semiconductor devices are more highly integrated. The increase in the resistance and the capacity of the wiring due to the increasing fineness of the wiring and the decrease in the pitch of the wiring cause a decrease in the operating speed of semiconductor devices and an increase in the consumption of electricity. Therefore, the multilayer wiring using copper (Cu) having a small electric resistance as the wiring material and a low permittivity film as the interlayer insulating film is essential for satisfying the requirements for the increased integration, the decreased consumption of electricity and the increased operating speed.

As the insulating material for the insulating film disposed between wirings and the insulating film disposed between wiring layers, it is studied that, in place of silicon oxide films formed in accordance with the chemical vapor deposition (CVD) process or the spin-on coating process which are widely used currently, low permittivity materials having smaller permittivities than those of the silicon oxide films described above such as silicon oxide films containing fluorine, silicon oxide films containing carbon and films of hydrogen silsesquioxane (HSQ), methylsilsesquioxane (MSQ), polyallyl ether (PAE) and nanoclustering silica are used. The insulating film formed with a material having a small permittivity such as those described above will be occasionally referred to as the low permittivity insulating film (the Low-k film), hereinafter.

As for the wiring material, the use of a Cu wiring comprising Cu having a small electric resistance as the main component in place of the Al wiring comprising aluminum as the main component, which is widely used currently, has been studied. Since etching of the Cu wiring is more difficult than the Al wiring, etching is conducted in accordance with the technology called the damascene process. The damascene process is roughly divided into the single damascene process and the dual damascene process.

The single damascene process is a process applied mainly to the formation of a wiring having a singly layer. A wiring groove having a prescribed wiring pattern is formed on an insulating film and, then, an electroconductive layer is formed on the insulating film in a manner such that the wiring groove is filled as an integral portion of the electroconductive layer. Then, the electroconductive layer is removed by polishing in accordance with a conventional polishing process such as the chemical mechanical polishing (CMP) to expose the insulating film, and the surface of the insulating film is made flat to form an embedded wiring.

For example, as shown in FIG. 6(a), an underlayer insulating film 12 is formed on a semiconductor substrate 11 on which elements such as transistors have been formed and, then, an etching stopper layer 13, a low permittivity insulating film 14 and a cap insulating film 15 are successively formed. Before the etching stopper layer 13 is formed, a contact plug (not shown in the figure) is formed on the underlayer insulating film 12 in a manner such that the contact plug reaches the substrate 11 although this structure is not shown in the figure.

A wiring groove 16 is formed by etching the cap insulating film 15 and the low permittivity insulating film 14 in accordance with the photolithography treatment and the etching process. Then, a barrier film 17 and a seed layer for plating comprising Cu (not shown in the figure) are successively formed by deposition on the cap insulating film 15 in a manner such that the barrier layer 17 and the seed layer coat the inner wall of the wiring groove 16. An electroconductive layer comprising Cu (not shown in the figure) is formed by deposition on the seed layer comprising Cu in accordance with the plating process in a manner such that the wiring groove 16 is filled as an integral portion of the electroconductive layer. The electroconductive layer (including the seed layer) and the barrier layer 17 are removed by polishing, and an embedded wiring of Cu (a lower wiring) 18 is formed in the wiring groove 16.

The dual damascene process is applied when a multilayer wiring structure comprising a lower wiring and an upper wiring is formed. A contact hole connected to the lower wiring and a wiring groove connected to the contact hole are formed in an insulating film in accordance with the dry etching and, then, the contact hole and the wiring groove are filled as integral portions of an electroconductive layer. The electroconductive layer is removed by polishing, and a contact plug formed by filling the contact hole and connected to the lower wiring and the upper wiring formed by filling the wiring groove are simultaneously formed.

For example, as shown in FIG. 6(b), an etching stopper layer 19, a low permittivity insulating film 20, an etching stopper layer 21, a low permittivity insulating film 22 and a cap insulating film 23 are successively formed on a lower wiring 18 formed in accordance with the single damascene process. Then, a contact hole 24 is opened by etching the cap insulating film 23, the low permittivity insulating film 22, the etching stopper layer 21 and the low permittivity insulating film 20, and a wiring groove 25 is opened by etching the cap insulating film 23 and the low permittivity insulating film 22. Thereafter, the lower wiring 18 is exposed by removing the etching stopper layer 19 by etching.

Then, as shown in FIG. 6(c), a barrier film 26 and a seed layer for plating comprising Cu (not shown in the figure) are successively formed by deposition on the cap insulating film 23 in a manner such that the formed films coat the inner walls of the wiring groove 25 and the contact hole 24. An electroconductive layer comprising Cu (not shown in the figure) is formed by deposition on the seed layer in a manner such that the wiring groove 25 and the contact hole 24 are filled as integral portions of the electroconductive layer. Then, the electroconductive layer (including the seed layer) and the barrier layer 26 are removed in accordance with the CMP process or the like so that the surface of the cap insulating film 23 is exposed In this manner, a contact plug 28 comprising Cu is formed in the contact hole 24, and an embedded wiring of Cu (an upper wiring) 29 is formed in the wiring groove 25.

In the damascene processes described above, Cu constituting the lower wiring 18 which is exposed after etching of the etching stopper layer 19 described with reference to FIG. 6(b) is oxidized and scattered by sputtering. The scattered substances comprising oxides of Cu (Cu compounds) are left remaining as etching residues on the surface of the (low permittivity) insulating films constituting the side wall of the contact hole 24 or the wiring groove 25 and on the surface of the lower wiring 18. When the upper wiring 29 and the contact plug 28 are formed as described with reference to FIG. 6(c) without removing the residues comprising the Cu compounds, the resistance of the upper wiring 29 and the lower wiring 18 is increased, and the leak current between wirings in the same wiring layer is increased due to diffusion of Cu from the Cu compounds to the low permittivity insulating films 20 and 22.

After the barrier film 26 is formed on the inner walls of the wiring groove 25 and the contact hole 24 and filled as an integral portion of the electroconductive layer comprising Cu, polishing is conducted in accordance with the CMP process to remove the excessive electro-conductive layer. After the polishing, polishing residues and polishing powder (slurry) are left remaining on the surface of the cap insulating film 23 and the upper wiring 29. The polishing powder in the fine powder condition can be removed with a jet stream of pure water or by cleaning with a brush. However, the polishing residues comprising Cu compounds such as cupper oxide (CuO) and copper hydroxide (CuOH) cannot be removed easily. When the polishing residues are left remaining, the resistance of the upper wiring 29 and the leak current between wirings in the same wiring layer is increased similarly to case where the etching residues are left remaining. In particular, when the cap insulating film 23 is a low permittivity insulating film, the leak current is increased remarkably since Cu is easily diffused from the Cu compounds.

To remove the etching residues and the polishing residues, a cleaning treatment for removing the etching residues and the polishing residues described above is conducted using a cleaning fluid comprising an alkaline or acidic aqueous solution (occasionally referred to as an aqueous solution-based cleaning agent, hereinafter).

However, as shown in FIG. 7(a), when the wiring groove 25 and the contact hole 24 in such a condition that the lower wiring 18 is exposed is cleaned using an aqueous solution-based cleaning agent, the low permittivity insulating films 20 and 22 exposed at the side wall of the wiring groove 25 or the contact hole 24 are easily invaded and etched with the aqueous solution-based cleaning agent. Due to the invasion and the etching, the low permittivity insulating films 20 and 22 exposed at the side wall of the wiring groove 25 or the contact hole 24 recede as shown by the arrows A, resulting in the condition such that the wiring groove 25 or the contact hole 24 have side walls of the eaves shape.

As shown in FIG. 7(b), when the barrier film 26 is formed so that the barrier film 26 coats the inner walls of the wiring groove 25 and the contact hole 24 in the above condition, the barrier film 26, which has the object of preventing diffusion of Cu, does not provide the sufficient coverage. Coverage of the seed layer formed on the barrier film 26 is also insufficient. Under the above condition, poor filling takes place and voids V are formed when the wiring groove 25 and the contact hole 24 are filled as integral portions of the electroconductive layer comprising Cu. Since the coverage with the barrier film 26 is insufficient, Cu diffuses into the low permittivity insulating films 20 and 22. The processing dimension of the wiring pattern changes, and short circuit takes place between adjacent wirings in the same layer and in upper and lower layers. The hygroscopic property of the low permittivity insulation film is enhanced, and the permittivity is increased. Due to the above reasons, detailed examinations are necessary for selecting the aqueous solution-based cleaning agent and deciding the conditions of the use of the agent.

Since a further decrease in the permittivity is required recently, porous materials are used as the low permittivity insulating film. When the porous low permittivity insulating film is treated with the aqueous solution-based cleaning agent, problems arise in that water in the aqueous solution-based cleaning agent is absorbed with the film and the permittivity of the film is increased, and that the aqueous solution-based cleaning agent does not penetrate into fine pores due to the surface tension, and contaminating substances in the fine pores cannot be removed.

Cleaning using a supercritical fluid of carbon dioxide which has a small surface tension and is a gas at the ordinary temperature and pressure is widely studied. For example, in Japanese Patent Application Laid-Open Nos. Heisei 10(1998)-99806 and Heisei 10(1998)-135170, methods in which inorganic contaminating substances are converted into substances soluble into a supercritical fluid of carbon dioxide by treating the substances with an acid, a base, a chelating agent, a ligand agent or an agent containing a halogen and, then, are removed by dissolving into the supercritical fluid of carbon dioxide, are described.

However, this method of cleaning has drawbacks in that conventional acids, bases and chelating agents which are used in aqueous solutions are not easily dissolved into the supercritical fluid of carbon dioxide since the supercritical fluid of carbon dioxide is apolar (hydrophobic), and that many conventional acids, bases and chelating agents exhibit the function in aqueous solutions but not in the supercritical fluid of carbon dioxide.

In particular, when this method of cleaning is applied to the cleaning of a wiring structure having Cu wiring and the low permittivity insulating film, a problem arises in that additives such as acids, bases and chelating agents and the supercritical fluid of carbon dioxide are separated from each other to cause precipitation of the additives alone on the surface of the Cu wiring and the low permittivity insulating film, and the additives in great concentrations are brought into contact with the Cu wiring and the low permittivity insulating film to cause invasion of the Cu wiring and the low permittivity insulating film. As another problem, the separated additives are not sufficiently removed (rinsed) from the surface of the Cu wiring and the low permittivity insulating film, and the contamination remains. Although the β-diketone described as an example in the above references can remove Cu oxide (CuO), metallic Cu which is not oxidized is also etched. This causes invasion of Cu in the lower wiring during the cleaning, and voids are formed.

In Japanese Patent Application Laid-Open No. 2004-249189, it is described that tertiary amines are most useful among organic amine compounds added to a supercritical fluid of carbon dioxide as the auxiliary agent for dissolution based on the reactivity of the organic amine compound and the supercritical fluid of carbon dioxide.

However, 2-diethylethanolamine, 1-dimethylamino-2-propanol and triethylamine which are described as the examples of the tertiary amine in Japanese Patent Application Laid-Open No. 2004-249189 does not dissolve copper compounds in the supercritical fluid of carbon dioxide although these amines dissolve copper compounds in aqueous solutions.

DISCLOSURE OF THE INVENTION

Under the above circumstances, the present invention has an object of providing a method of cleaning and a process for producing a semiconductor device, in which etching residues and polishing residues comprising metal compounds, in particular, copper compounds, can be selectively removed from the wiring material in the method of cleaning using the supercritical fluid of carbon dioxide.

As the result of intensive studies by the present inventors to achieve the above object, it was found that, in the method of cleaning for removing metal compounds attached to the surface of a substrate, the above object could be achieved by cleaning by supplying a supercritical fluid of carbon dioxide comprising at least one of triallylamine and tris(3-aminopropyl)amine to the surface of the substrate. The present invention has been completed based on the knowledge.

The present invention provides:

1. A method of cleaning for removing metal compounds attached to a surface of a substrate, wherein the cleaning is conducted by supplying a supercritical fluid of carbon dioxide comprising at least one of triallylamine and tris(3-aminopropyl)amine to the surface of the substrate;
2. A process for producing a semiconductor device which comprises (A) a step of forming an insulating film on a substrate having an electroconductive layer disposed at a front side, (B) a step of forming a depression reaching the electroconductive layer on the insulating film by etching, and (C) a step of removing etching residues comprising metal compounds derived from the electroconductive layer by cleaning by supplying a supercritical fluid of carbon dioxide comprising at least one of triallylamine and tris(3-aminopropyl)amine to a surface of the substrate on which the depression has been formed on the insulating film;
3. A process for producing a semiconductor device described above in 2, wherein the insulating film comprises a low permittivity insulating film comprising a material having a permittivity smaller than a permittivity of silicon oxide, and the low permittivity insulating film is exposed to a side wall of the depression;
4. A process for producing a semiconductor device described above in 2, wherein the electroconductive layer is formed with a material comprising copper, and the metal compounds comprise copper compounds;
5. A process for producing a semiconductor device which comprises (A') a step of forming a depression on an insulating film disposed on a substrate, (B') a step of forming an electroconductive layer on the insulating film in a manner such that the depression is filled as an integral portion of the electroconductive layer, (C') a step of removing the electroconductive layer by polishing so that a formed surface is substantially on a same plane with a surface of the insulating film, and (D') a step of removing polishing residues comprising metal compounds derived from the electroconductive layer by cleaning by supplying a supercritical fluid of carbon dioxide comprising at least one of triallylamine and tris(3-aminopropyl)amine to a surface of the substrate on which the electroconductive layer is exposed at the surface substantially on the same plane with the surface of the insulating film;
6. A process for producing a semiconductor device described above in 5, wherein the insulating film comprises a low permittivity insulating film comprising a material having a permittivity smaller than permittivity of silicon oxide, and a surface at a front side of the insulating film is formed with the low permittivity insulating film; and
7. A process for producing a semiconductor device described above in 5, wherein the electroconductive layer is formed with a material comprising copper, and the metal compounds comprise copper compounds.

Figure 1:
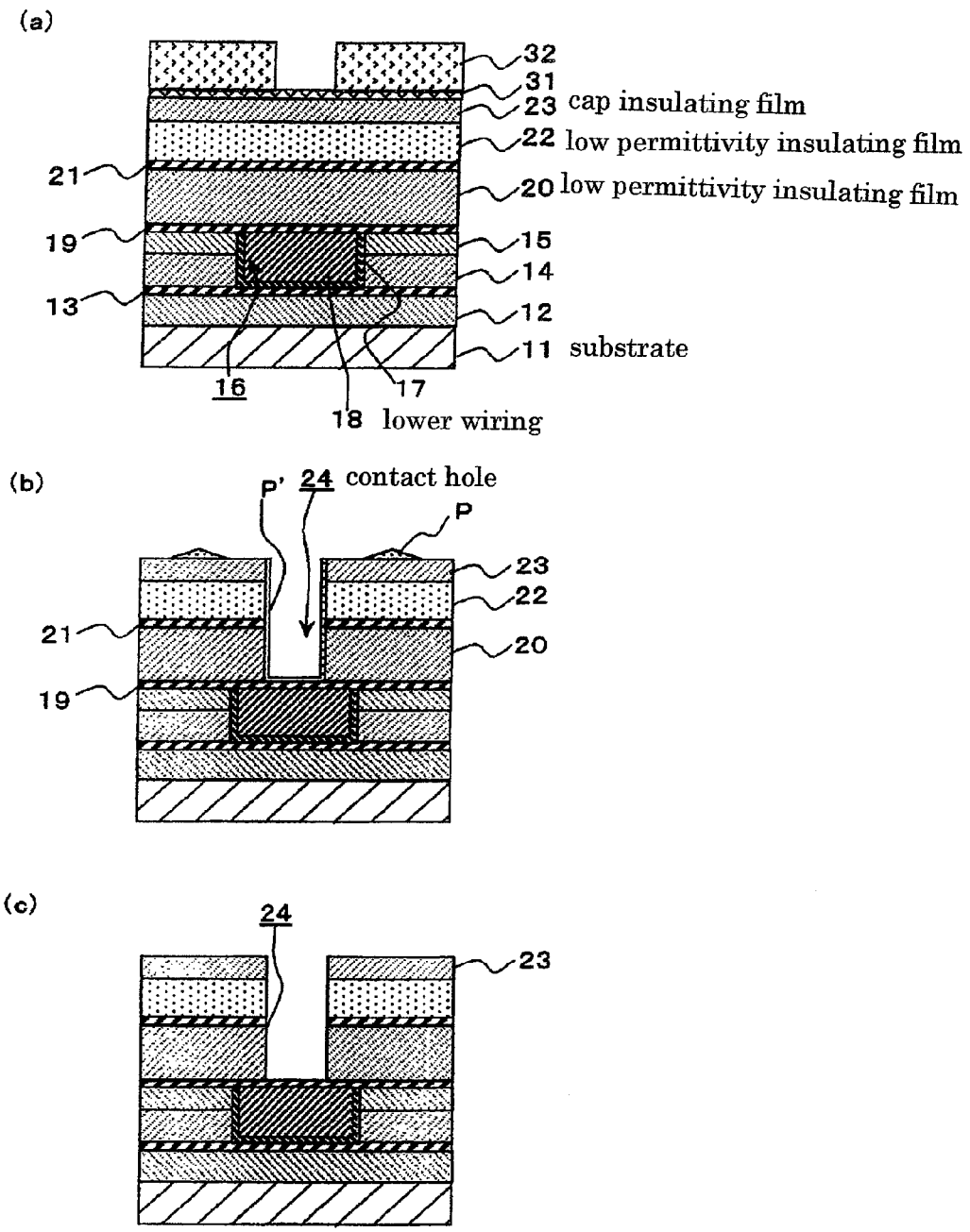
FIG. 1 shows sectional view (1) exhibiting a production step in the first embodiment of the process for producing a semiconductor device of the present invention.

In the Figures, reference numerals mean as follows: 11: A substrate; 18: a lower wiring (the first electroconductive layer); 20 and 22: low permittivity insulating films; 23: a cap insulating film; 24: a contact hole; 25: a wiring groove; 28: a contact plug; 29: an upper wiring; 18' and 27': metal compounds; and S and S': boards.

THE MOST PREFERRED EMBODIMENT TO CARRY OUT THE INVENTION

The method of cleaning of the present invention is a method of cleaning for removing metal compounds attached to the surface of a substrate, wherein the cleaning is conducted by supplying a supercritical fluid of carbon dioxide comprising at least one of triallylamine and tris(3-aminopropyl)amine to the surface of the substrate.

In accordance with the method of cleaning, the chelating action of the organic amine compound to the metal in metal compounds is enhanced by adding at least one of the organic amine compounds shown as the examples to a supercritical fluid of carbon dioxide. Complex compounds of the organic amine compound and the metal are formed due to this effect, and the metal compounds are efficiently removed.

The first embodiment of the process for producing a semiconductor device of the present invention comprises the following steps:

(A) A step of forming an insulating film on a substrate having an electroconductive layer disposed at a front side.

(B) A step of forming a depression reaching the electroconductive layer on the insulating film by etching.

(C) A step of removing etching residues comprising metal compounds derived from the electroconductive layer by cleaning by supplying a supercritical fluid of carbon dioxide comprising at least one of triallylamine and tris(3-aminopropyl)amine to the surface of the substrate in a condition such that the depression is formed on the insulating film.

Figure 2:
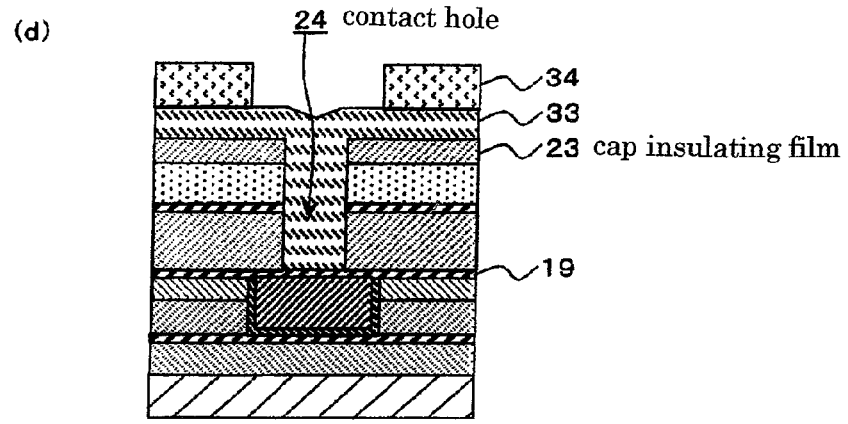
FIG. 2 shows sectional view (2) exhibiting a production step in the first embodiment of the process for producing a semiconductor device of the present invention.
Figure 2:
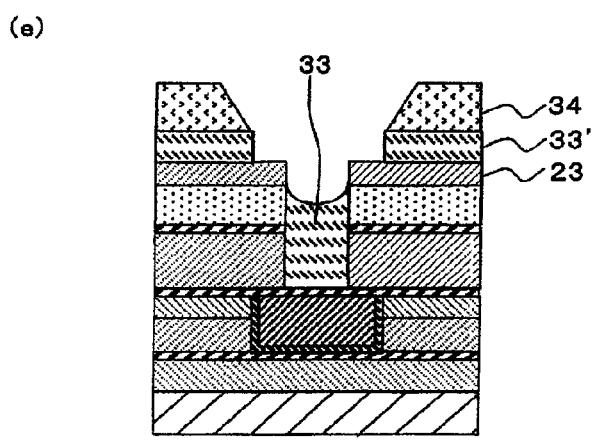
Figure 2:
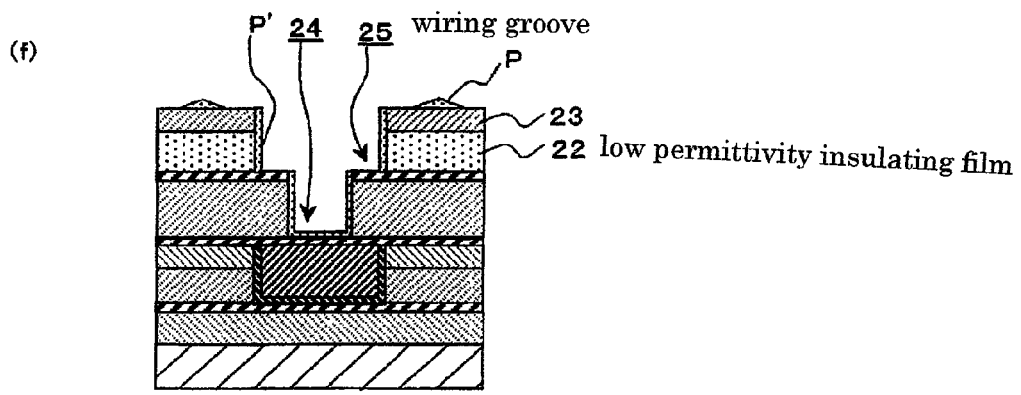
Figure 3:
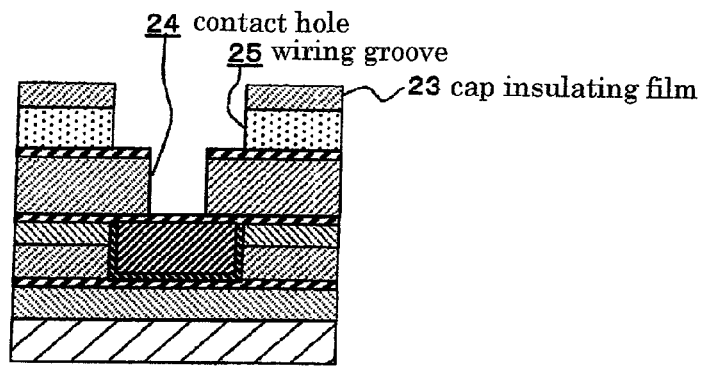
FIG. 3 shows sectional view (3) exhibiting a production step in the first embodiment of the process for producing a semiconductor device of the present invention.
Figure 3:
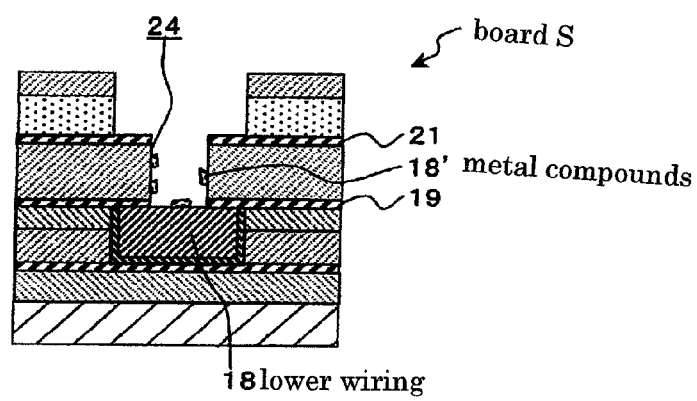
Figure 3:
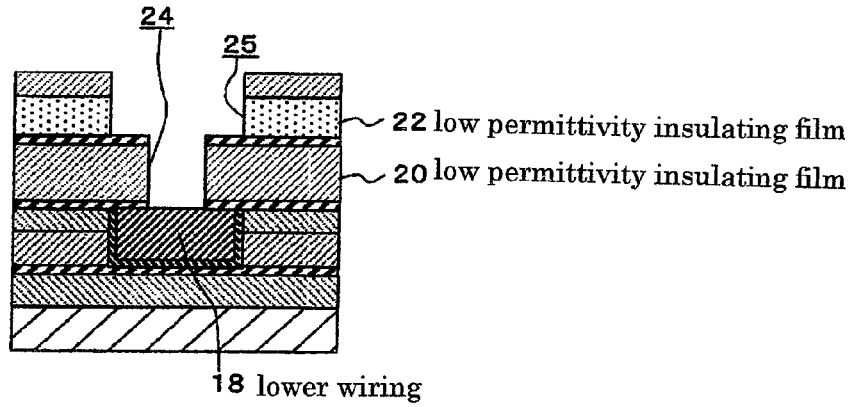

The above process is an embodiment of the process for producing a semiconductor device using the method of cleaning of the present invention and is related to the formation of the dual damascene structure. The first embodiment of the present invention will be described in the following with reference to FIGS. 1 to 3 showing sectional views exhibiting the production step.

In step (A), as shown in FIG. 1(a), an etching stopper layer 13 comprising, for example, SiC or SiCN is formed on a semiconductor substrate (substrate) 11 on which an element such as a transistor is formed via an underlayer insulating film 12 comprising, for example, $SiO_2$. Then, a laminate film comprising a low permittivity insulating film 14 comprising, for example, an inorganic low permittivity material such as MSQ, i.e., silicon oxide containing carbon (SiOC), and a cap insulating film 15 comprising $SiO_2$ is formed as the insulating film between wirings. A contact plug (not shown in the figure) reaching the substrate 11 is formed on the underlayer insulating film 12 before the etching stopper layer 13 is formed although this procedure is not shown in the figure.

A wiring groove 16 is formed by etching the cap insulating film 15 and the low permittivity insulating film 14 in accordance with the photolithography treatment and the etching process. Then, a barrier layer 17 comprising, for example, TaN and a seed layer for plating comprising Cu (not shown in the figure) are successively formed by deposition on the cap insulating film 15 in a manner such that the inner wall of the wiring groove 16 is coated. An electroconductive layer comprising Cu (not shown in the figure) is formed by deposition on the seed layer in accordance with the plating process in a manner such that the wiring groove 16 is filled as an integral portion of the electroconductive layer. Then, the electroconductive layer (including the seed layer) and the barrier layer 17 are removed, for example, in accordance with the CMP process so that the surface of the cap insulating film 15 is exposed, and an embedded wiring of Cu (the lower wiring) 18 is formed in the wiring groove 16.

Thereafter, an etching stopper layer 19 comprising, for example, SiC or SiCN is formed on the lower wiring 18 and the cap insulating film 15. On the formed etching stopper layer 19, a low permittivity insulating film 20 comprising SiOC is formed as the insulating film between wirings. After another etching stopper layer 21 comprising, for example, SiC or SiCN is formed on the low permittivity insulating film 20, a laminate film comprising a low permittivity insulating film 22 comprising, for example, an organic low permittivity material such as polyallyl ether (PAE) and a cap insulating film 23 comprising $SiO_2$ is formed as the insulating film between wirings. In the above, the cap insulating film 23 is formed with $SiO_2$. However, the cap insulating film 23 may be formed with SiOC.

After an antireflection film 31 comprising, for example, an acrylic polymer is formed on the cap insulating film 23, a resist mask 32 having a prescribed contact hole pattern is formed on the antireflection film 31.

In step (B), as shown in FIG. 1(b), a contact hole 24 is opened by etching the antireflection film 31, the cap insulating film 23, the low permittivity insulating film 22, the etching stopper layer 21 and the low permittivity insulating film 20 through the resist mask 32, and the etching is stopped at the surface of the etching stopper layer 19. When the resist mask 32 is peeled off in accordance with the ashing treatment, resist residues P are left remaining on the cap insulating film 23, and polymer residues P' which are reaction products of the etching gas and the resist mask 32 are attached to the inner wall of the contact hole 24.

Then, as shown in FIG. 1(c), the resist residues P on the cap insulating film 23 described above (refer to FIG. 1(b) shown above) and the polymer residues P' attached to the inner wall of the contact hole 24 described above (refer to FIG. 1(b) shown above) are removed.

Then, as shown in FIG. 2(d), a resist layer 33 is formed on the cap insulating film 23 in a manner such that the contact hole 24 is filled as an integral portion of the resist layer so that the etching stopper layer 19 is not etched during the formation of a wiring groove. Thereafter, a resist mask 34 having a wiring groove pattern is formed on the resist layer 33 for the formation of the wiring groove.

Then, as shown in FIG. 2(e), the resist layer 33 is etched through the resist mask 34, and a resist mask 33' having the wiring groove pattern is formed on the cap insulating film 23.

Then, as shown in FIG. 2(f), the cap insulating film 23 and the low permittivity insulating film 22 are etched through the resist mask 34, and the etching is stopped at the etching stopper layer 21 so that a wiring groove 25 connected to an upper portion of the connecting hole 24 is opened. Thereafter, the resist layer 33 (refer to FIG. 2(e) shown above) filling the contact hole 24 is removed by etching, and the etching is stopped at the surface of the etching stopper layer 19. When the resist masks 34 and 33' (refer to FIG. 2(e) shown above) are peeled off in accordance with the ashing treatment, resist residues P are left remaining on the cap insulating film 23, and polymer residues P' which are reaction products of the etching gas and the resist mask 32 are attached to the side wall of the wiring groove 25 and the inner wall of the contact hole 24.

Then, as shown in FIG. 3(g), the resist residues P on the cap insulating film 23 described above (refer to FIG. 2(f) shown above), and the polymer residues P' attached to the side wall of the wiring groove 25 and the inner wall of the contact hole 24 (refer to FIG. 2(f) shown above) are removed.

Then, as shown in FIG. 3(h), the etching stopper layer 19 is etched using the etching stopper layer 21 as the mask so that the contact hole 24 is connected to the lower wiring 18. At this time, Cu constituting the exposed lower wiring 18 is oxidized, and Cu oxides (metal compounds) 18' are scattered. The scattered oxides form etching residues which are attached to the surface of the low permittivity insulating film 20 exposed at the side walls of the contact hole 24 and the lower wiring 18.

Then, in step (C), the substrate 11 in such a condition that the lower wiring 18 is exposed at the bottom portion of the contact hole 24 is treated in accordance with the cleaning treatment of the present invention. The substrate 11 in the above condition will be referred to as board S. Specifically, the cleaning is conducted by supplying a supercritical fluid of carbon dioxide comprising at least one of triallylamine and tris(3-aminopropyl)amine to the surface of board S.

In the above treatment, board S is contained in a treating chamber for the cleaning treatment. After the treating chamber is tightly closed, a supercritical fluid of carbon dioxide is introduced into the treating chamber. The supercritical fluid of carbon dioxide is supplied in the gaseous state. The temperature and the pressure are adjusted in a manner such that the supercritical fluid of carbon dioxide is not converted into a fluid in the treating chamber. The temperature and the pressure are adjusted in the ranges of 35 to 80° C. and 10 to 30 MPa, respectively.

At least one of triallylamine and tris(3-aminopropyl)amine described above is added to and dissolved into the supercritical fluid of carbon dioxide supplied into the treating chamber as described above. The organic amine compound (the tertiary amine) may be added to the supercritical fluid of carbon dioxide singly or as a combination of a plurality of compounds.

It is preferable that the concentration of the organic amine compound described above is 0.5 to 5% by volume in the supercritical fluid of carbon dioxide at 35° C. under 10 MPa. When the concentration of the organic amine compound is 0.5% by volume or greater, the etching residues comprising the metal compounds can be completely removed. When the concentration of the organic amine compound is 5% by volume or smaller, the organic amine compound is completely dissolved into the supercritical fluid of carbon dioxide, and no phase separation takes place.

As described above, the cleaning is conducted by supplying the supercritical fluid of carbon dioxide to which the organic amine compound described above is added to the surface of board S. In this cleaning, as shown in FIG. 3(i), a complex compound between the metal in the metal compounds 18' (refer to FIG. 3(h)) and the organic amine compound described above is formed due to the chelating action of the organic amine compound described above, and the metal compounds 18' are removed. At this time, the lower wiring 18 is not invaded, and the metal compound 18' is removed selectively. Thereafter, in the treating chamber, the supercritical fluid of carbon dioxide to which the organic amine compound has been added is replaced with the supercritical fluid of carbon dioxide to which the organic amine compound is not added. The rinsing treatment of board S can be conducted by this treatment.

In accordance with the method of cleaning and the process for producing a semiconductor device described above, the metal compounds 18' can be selectively and efficiently removed from Cu constituting the lower wiring 18 by adding at least one of the organic amine compounds shown as the examples to the supercritical fluid of carbon dioxide. Due to this treatment, the increase in resistance of the lower wiring 18 and the upper wiring 29 due to the residual metal compound 18' can be prevented, and the increase in the leak current due to diffusion of the metal from the metal compounds 18' to the low permittivity insulating films 20 and 22, in particular, can be prevented. Therefore, the reliability of the wiring can be improved, and the yield of the semiconductor device can be increased.

Absorption of moisture with the low permittivity insulation films 20 and 22 exposed at the side walls of the wiring groove and the contact hole 24 can be prevented by the cleaning not using a liquid but using the supercritical fluid of carbon dioxide, and the low permittivity insulation films 20 and 22 can be kept at the condition of the low permittivity. Due to this effect, the increase in the capacity between wirings can be prevented. Moreover, the wiring pattern can be formed with excellent processing control since invasion and etching of the low permittivity insulating films 20 and 22 can be prevented.

The second embodiment of the process for producing a semiconductor device of the present invention comprises the following steps:

(A') A step of forming a depression on an insulating film disposed on a substrate.

(B') A step of forming an electroconductive layer on the insulating film in a manner such that the depression is filled as an integral portion of the electroconductive layer.

(C') A step of removing the electroconductive layer by polishing so that the formed surface is substantially on the same plane with the surface of the insulating film.

(D') A step of removing polishing residues comprising metal compounds derived from the electroconductive layer by cleaning by supplying a supercritical fluid of carbon dioxide comprising at least one of triallylamine and tris(3-aminopropyl)amine to the surface of the substrate in a condition such that the electroconductive layer is exposed at the surface substantially on the same plane with the surface of the insulating film.

In the second embodiment, a case such that, after step (A') has been completed in accordance with the production steps described with reference to FIGS. 1 to 3, the method of cleaning of the present invention applied to the formation of the contact plug and the upper wiring connected to the lower wiring 18 in accordance with step (B') and step (C') will be described.

In step (B'), as shown in FIG. 4(j), a barrier film 26 comprising, for example, TaN and a seed layer for plating comprising, for example, Cu (not shown in the figure) are successively formed on the cap insulating film 23, for example, in accordance with the sputtering process in a manner such that the inner walls of the wiring groove 25 and the contact hole 24 are coated. Then, an electroconductive layer 27 comprising, for example, Cu is formed by deposition on the seed layer, for example, in accordance with the plating process in a manner such that the wiring groove 25 and the contact hole 24 are filled as integral portions of the electroconductive layer.

Then, in step (C'), as shown in FIG. 4(k), the electroconductive layer 27 described above (refer to FIG. 4(j) shown above) including the seed layer and the barrier film 26 are removed, for example, in accordance with the CMP process in a manner such that the surface of the cap insulating film 23 is exposed and the surface of the electroconductive layer 27 is substantially on the same plane with the surface of cap insulating film 23. Due to this treatment, a contact plug 28 comprising Cu is formed in the contact hole 24, and an embedded wiring of Cu 29 (an upper wiring) is formed in the wiring groove 25. At this time, metal compounds 27' comprising Cu oxide or Cu hydroxide are formed on the surface of the cap insulating film 23 and the upper wiring 29 as polishing residues.

Thereafter, in step (D'), the cleaning treatment is conducted on the surface of the substrate 11 in the condition such that the upper wiring 29 is exposed on the same plane with the surface of the cap insulating film 23 in accordance with the same procedures as those described for the cleaning treatment in the first embodiment. When the substrate 11 in the above condition is referred to as board S', the cleaning is conducted by supplying the supercritical fluid of carbon dioxide comprising at least one of triallylamine and tris(3-aminopropyl)amine to the surface of board S'.

Due to the above treatment, as shown in FIG. 4(l), the polishing residues comprising the metal compounds 27' (refer to FIG. 4(k)) can be surely removed without invasion of the upper wiring 29. Thereafter, the steps from the formation of the etching stopper layer 19 shown with reference to FIG. 1(a) to the step shown with reference to FIG. 4(l) are conducted, and a multilayer wiring structure can be completed.

In accordance with the method of cleaning and the process for producing a semiconductor device described above, the metal compounds 27' can be efficiently removed from Cu constituting the upper wiring 29 by adding at least one of triallylamine and tris(3-aminopropyl)amine to the supercritical fluid of carbon dioxide. In accordance with the above method and process, the increase in resistance of the upper wiring 29 due to the residual metal compounds 27' can be prevented. The increase in the leak current due to diffusion of the metal from the metal compounds 27' to the cap insulating film 23 can also be prevented. Therefore, the reliability of the wiring can be improved, and the yield of the semiconductor device can be increased.

In the embodiment described above, the cap insulating film 23 is formed with $SiO_2$. When the cap insulating film 23 comprises a low permittivity material such as SiOC, the metal in the metal compounds 27' tends to be diffused when the metal compounds 27' are left remaining. However, the metal compounds 27' are surely removed in the above step of cleaning, and the effect of preventing the increase in the leak current can be remarkably exhibited. When the cap insulating film 23 is made of a low permittivity material, absorption of moisture with the cap insulating film 23 can be prevented, and the cap insulating film is kept at the condition such that the permittivity is low by conducting the cleaning not using a liquid but using the supercritical fluid of carbon dioxide, and the increase in the capacity between wirings can be prevented.

Figure 4:
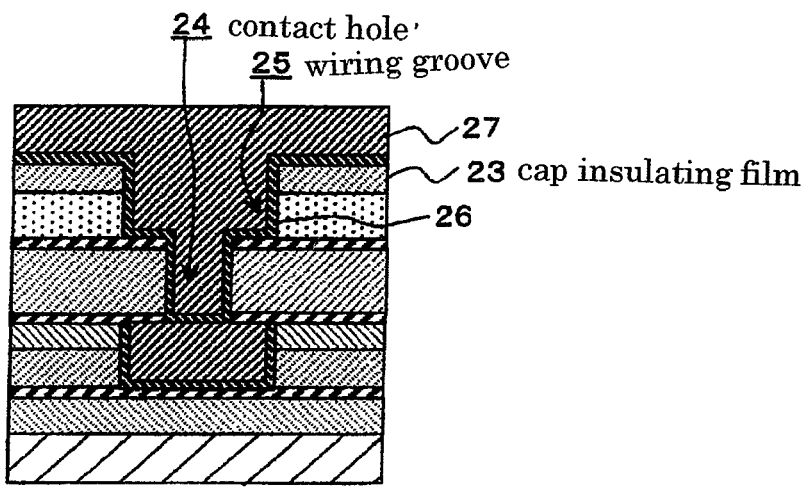
FIG. 4 shows a sectional view exhibiting a production step in the second embodiment of the process for producing a semiconductor device of the present invention.
Figure 4:
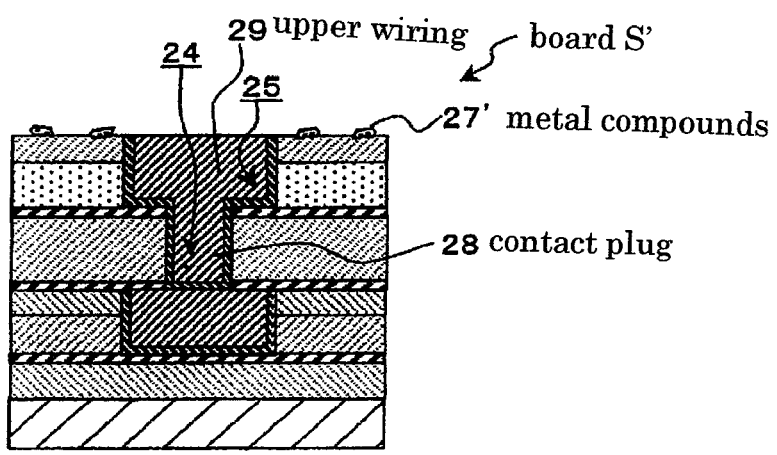
Figure 4:
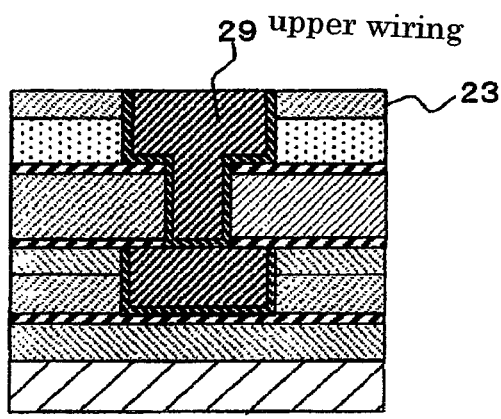
Figure 5:
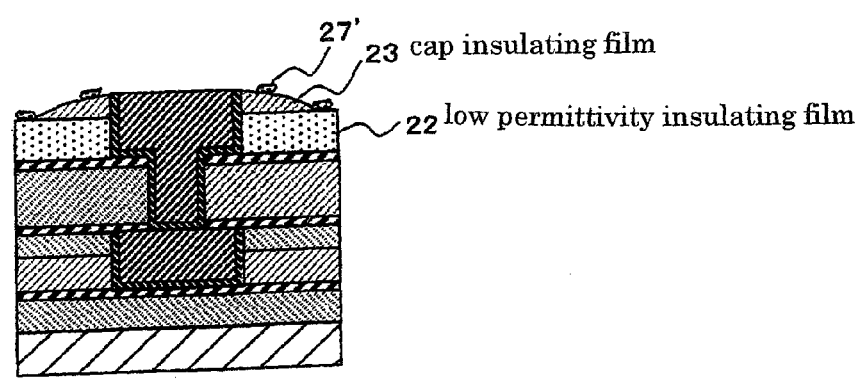
FIG. 5 shows a sectional view exhibiting a production step, which is modified process 1, in the second embodiment of the process for producing a semiconductor device of the present invention.
Figure 6:
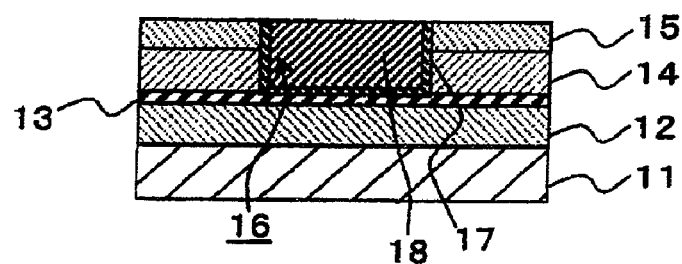
FIG. 6 shows a sectional view exhibiting a production step of a conventional process for producing a semiconductor device.
Figure 6:
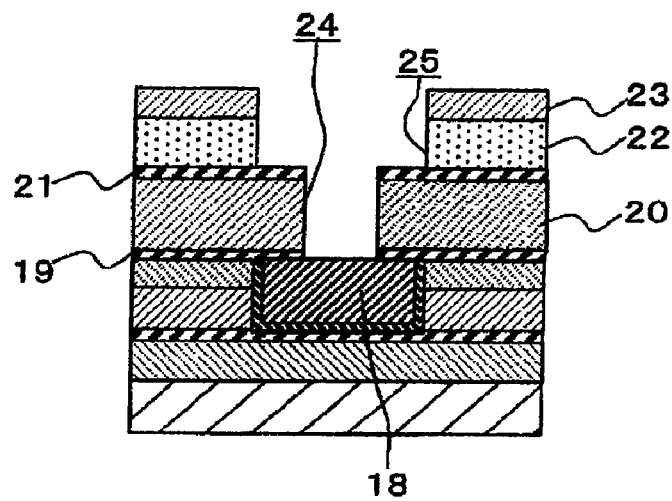
Figure 6:
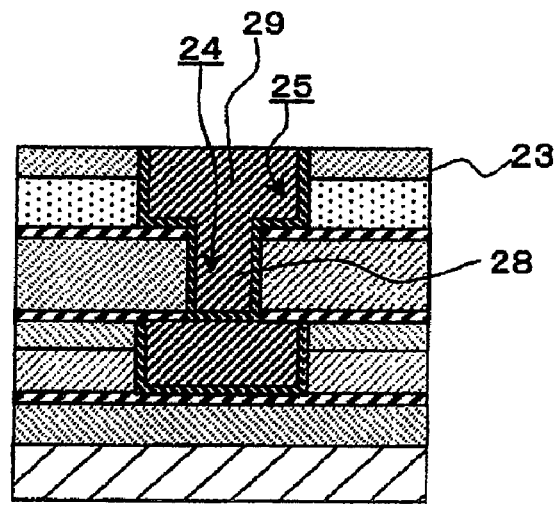
Figure 7:
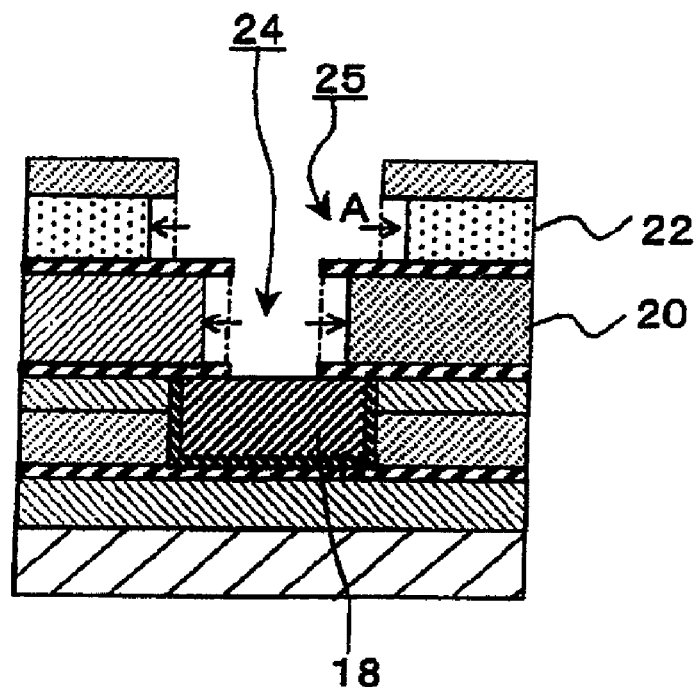
FIG. 7 shows a sectional view exhibiting a production step in which a problem in a conventional process for producing a semiconductor device is shown.
Figure 7:
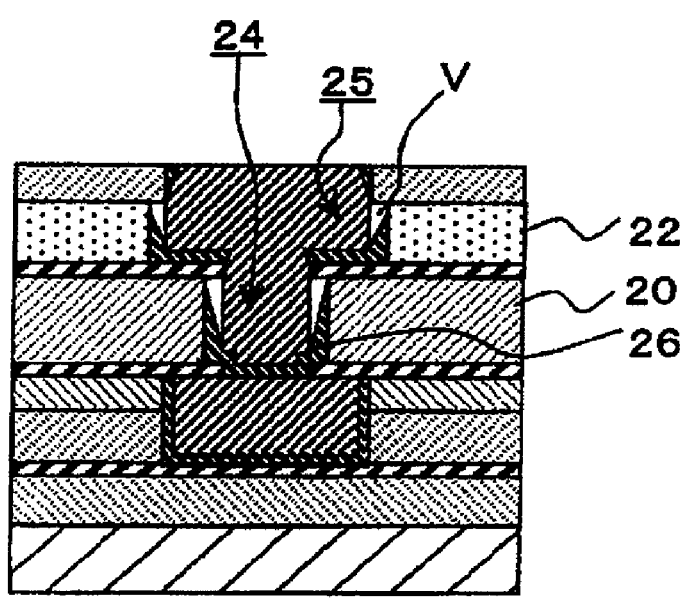

As modified example 1 of the second embodiment, in the CMP process described with reference to FIG. 4(*k*), the cap insulating film 23 may be locally polished to form a depression as shown in FIG. 5, and a portion of the low permittivity insulating film 22 may be exposed. In this case, similarly to the case where the cap insulating film is made of a low permittivity material such as SiOC, the metal in the metal compounds 27' tends to be diffused when the metal compounds 27' are left remaining. The metal compounds 27' can be surely removed by conducting the above step of cleaning, and the effect of preventing the increase in the leak current can be remarkably exhibited. Moreover, since the low permittivity film 22 is kept at the condition such that the permittivity is kept low, the increase in the capacity between wirings can be prevented.

In the embodiment described above, Cu is used as the material for the lower wiring 18, the contact plug 28 and the upper wiring 29. However, the material constituting the wirings and the contact plug is not particularly limited. It is preferable that an electroconductive material containing Cu such as Cu and an alloy of Cu is used as the constituting material described above since the chelating effect with the organic amine compound is great, and the etching residues or polishing residues comprising Cu compounds can be removed more efficiently and more surely.

In the embodiment described above, the insulating film between wirings and the insulating film between wiring layers comprise the low permittivity insulating film. The present invention can also be applied when the insulating film between wirings and the insulating film between wiring layers do not comprise the low permittivity insulating film. However, the effect of the present invention is exhibited more remarkably and the process for producing a semiconductor device of the present invention can be used more advantageously when the insulating film between wirings and the insulating film between wiring layers comprise the low permittivity insulating film. As the low permittivity insulating film used in the present invention, films other than films of SiOC (MSQ) and PAE used in the above embodiments such as films of SiOF, HSQ and nanocluster silica, low permittivity films of these materials and porous films obtained by forming pores in $SiO_2$ films can also be suitably used.

In the above embodiments, the process for producing a semiconductor device having the dual damascene wiring structure is used as the example. The process can be applied also to devices having the single damascene structure.

EXAMPLES

The present invention will be described more specifically with reference to examples in the following. However, the present invention is not limited to the examples.

Examples of the First Embodiment

Example 1

The cleaning treatment was conducted for 10 minutes by supplying a mixture obtained by adding 2% by volume of triallylamine to a supercritical fluid of carbon dioxide at 35° C. under 10 MPa to the surface of board S obtained by removing the etching stopper layer 19 by etching as shown in FIG. 3(*h*). Then, the rinsing treatment was conducted for 10 minutes by using the supercritical fluid of carbon dioxide alone.

Example 2

The cleaning treatment and the rinsing treatments were conducted in accordance with the same procedures as those conducted in Example 1 except that a mixture obtained by adding 2% by volume of tris(3-aminopropyl)amine to the supercritical fluid of carbon dioxide was supplied.

Example 3

The cleaning treatment and the rinsing treatments were conducted in accordance with the same procedures as those conducted in Example 1 except that a mixture obtained by adding 1% by volume of triallylamine and 1% by volume of tris(3-aminopropyl)amine to the supercritical fluid of carbon dioxide was supplied.

Comparative Example 1

The cleaning treatment and the rinsing treatments were conducted in accordance with the same procedures as those conducted in Example 1 except that a mixture obtained by adding 2% by volume of β-diketone to the supercritical fluid of carbon dioxide was supplied.

Comparative Example 2

The cleaning treatment and the rinsing treatments were conducted in accordance with the same procedures as those conducted in Example 1 except that a mixture obtained by adding 2% by volume of diethylaminoethanol to the supercritical fluid of carbon dioxide was supplied.

Comparative Example 3

The cleaning treatment and the rinsing treatments were conducted in accordance with the same procedures as those conducted in Example 1 except that a mixture obtained by adding 2% by volume of 1-dimethylamino-2-propanol to the supercritical fluid of carbon dioxide was supplied.

Comparative Example 4

The cleaning treatment and the rinsing treatments were conducted in accordance with the same procedures as those conducted in Example 1 except that a mixture obtained by adding 2% by volume of triethylamine to the supercritical fluid of carbon dioxide was supplied.

When boards S after being treated by the cleaning treatment in Examples 1 to 3 and boards S after being treated by the cleaning treatment in Comparative Examples 1 to 4 were compared, it was confirmed that, in boards S after being treated by the cleaning treatment in Examples 1 to 3, the permittivity of the low permittivity insulating film was not increased, the width of opening at the wiring groove 25 and the contact hole 24 was not increased, and etching residues comprising the metal compounds 18' was surely removed from the surface of the low permittivity insulating film 20 exposed at the side wall of the contact hole 24 and the surface of the lower wiring 18 as shown in FIG. 3.

In contrast, in board S treated in Comparative Example 1, it was confirmed that the surface of the lower wiring 18 was invaded although the etching residues comprising the metal compounds 18' was almost completely removed after the cleaning treatment. In boards S treated in Comparative Examples 2 to 4, it was confirmed that almost no etching residues comprising the metal compounds 18' were removed.

Examples of the Second Embodiment

Example 4

The cleaning treatment was conducted for 10 minutes by supplying a mixture obtained by adding 2% by volume of triallylamine to a supercritical fluid of carbon dioxide at 35° C. under 10 MPa to the surface of board S' obtained after the CMP treatment as shown in FIG. 4(*k*). Then, the rinsing treatment was conducted for 10 minutes by using the supercritical fluid of carbon dioxide alone. In the present example, the cap insulating film 23 was constituted with a low permittivity insulating film comprising SiOC.

Example 5

The cleaning treatment and the rinsing treatments were conducted in accordance with the same procedures as those conducted in Example 4 except that a mixture obtained by adding 2% by volume of tris(3-aminopropyl)amine to the supercritical fluid of carbon dioxide was supplied.

Example 6

The cleaning treatment and the rinsing treatments were conducted in accordance with the same procedures as those conducted in Example 4 except that a mixture obtained by adding 1% by volume of triallylamine and 1% by volume of tris(3-aminopropyl)amine to the supercritical fluid of carbon dioxide was supplied.

Comparative Example 5

The cleaning treatment and the rinsing treatments were conducted in accordance with the same procedures as those conducted in Example 4 except that a mixture obtained by adding 2% by volume of β-diketone to the supercritical fluid of carbon dioxide was supplied.

Comparative Example 6

The cleaning treatment and the rinsing treatments were conducted in accordance with the same procedures as those conducted in Example 4 except that a mixture obtained by adding 2% by volume of diethylaminoethanol to the supercritical fluid of carbon dioxide was supplied.

Comparative Example 7

The cleaning treatment and the rinsing treatments were conducted in accordance with the same procedures as those conducted in Example 4 except that a mixture obtained by adding 2% by volume of 1-dimethylamino-2-propanol to the supercritical fluid of carbon dioxide was supplied.

Comparative Example 8

The cleaning treatment and the rinsing treatments were conducted in accordance with the same procedures as those conducted in Example 4 except that a mixture obtained by adding 2% by volume of triethylamine to the supercritical fluid of carbon dioxide was supplied.

When boards S' after being treated by the cleaning treatment in Examples 4 to 6 and boards S' after being treated by the cleaning treatment in Comparative Examples 5 to 8 were compared, it was confirmed that, in boards S' after being treated by the cleaning treatment in Examples 4 to 6, the permittivity of the cap insulating film 23 comprising SiOC was not increased, the upper wiring 29 was not invaded, and polishing residues comprising the metal compound 27' was surely removed.

In contrast, in board S' treated in Comparative Example 5, it was confirmed that the surface of the upper wiring 29 was invaded although the etching residues comprising the metal compounds 27' was almost completely removed after the cleaning treatment. In boards S' treated in Comparative Examples 6 to 8, it was confirmed that almost no etching residues comprising the metal compounds 27' were removed.

INDUSTRIAL APPLICABILITY

In accordance with the method of cleaning of the present invention, since at least one of triallylamine and tris(3-aminopropyl)amine is added to a supercritical fluid of carbon dioxide, the chelating action of the organic amine compound described above to the metal in the metal compounds is enhanced, a metal complex compound of the organic amine compound and the metal is formed, and the metal compounds are efficiently removed.

In accordance with the process for producing a semiconductor device of the present invention, since at least one of triallylamine and tris(3-aminopropyl)amine is added to a supercritical fluid of carbon dioxide, a metal complex compound of the organic amine and the metal is formed due to the chelating function of the organic amine to the metal in the metal compounds without reaction with the electroconductive material constituting the electroconductive layer, and the metal compounds are selectively and efficiently removed from the electroconductive material constituting the electroconductive layer.

As described above, in accordance with the method of cleaning of the present invention and the process for producing a semiconductor device using the method of cleaning, etching residues and polishing residues containing metal compounds are selectively and efficiently removed from the electroconductive material constituting the electroconductive layer. Due to this effect, when the electroconductive layer is a wiring, an increase in the resistance of the wiring caused by the residual metal compounds can be prevented, and an increase in the leak current due to diffusion of the metal from the metal compounds to the insulating films can be prevented. Therefore, the reliability of the wiring can be enhanced, and the yield of the semiconductor device can be increased.

The invention claimed is:

1. A method of cleaning for removing metal compounds attached to a surface of a substrate, wherein the cleaning is conducted by supplying a supercritical fluid of carbon dioxide comprising at least one of triallylamine and tris(3-aminopropyl)amine to the surface of the substrate.

2. A process for producing a semiconductor device which comprises (A) a step of forming an insulating film on a substrate having an electroconductive layer disposed at a front side, (B) a step of forming a depression reaching the electroconductive layer on the insulating film by etching, and (C) a step of removing etching residues comprising metal compounds derived from the electroconductive layer by cleaning by supplying a supercritical fluid of carbon dioxide comprising at least one of triallylamine and tris(3-aminopropyl)

amine to a surface of the substrate on which the depression has been formed on the insulating film.

3. A process for producing a semiconductor device according to claim 2, wherein the insulating film comprises a low permittivity insulating film comprising a material having a permittivity smaller than a permittivity of silicon oxide, and the low permittivity insulating film is exposed to a side wall of the depression.

4. A process for producing a semiconductor device according to claim 2, wherein the electroconductive layer is formed with a material comprising copper, and the metal compounds comprise copper compounds.

5. A process for producing a semiconductor device which comprises (A') a step of forming a depression on an insulating film disposed on a substrate, (B') a step of forming an electroconductive layer on the insulating film in a manner such that the depression is filled as an integral portion of the electroconductive layer, (C') a step of removing the electroconductive layer by polishing so that a formed surface is substantially on a same plane with a surface of the insulating film, and (D') a step of removing polishing residues comprising metal compounds derived from the electroconductive layer by cleaning by supplying a supercritical fluid of carbon dioxide comprising at least one of triallylamine and tris(3-aminopropyl)amine to a surface of the substrate on which the electroconductive layer is exposed at the surface substantially on the same plane with the surface of the insulating film.

6. A process for producing a semiconductor device according to claim 5, wherein the insulating film comprises a low permittivity insulating film comprising a material having a permittivity smaller than permittivity of silicon oxide, and a surface at a front side of the insulating film is formed with the low permittivity insulating film.

7. A process for producing a semiconductor device according to claim 5, wherein the electroconductive layer is formed with a material comprising copper, and the metal compounds comprise copper compounds.

* * * * *